(12) United States Patent
Chan et al.

(10) Patent No.: US 8,154,115 B1
(45) Date of Patent: Apr. 10, 2012

(54) PACKAGE STRUCTURE HAVING MEMS ELEMENT AND FABRICATION METHOD THEREOF

(75) Inventors: Chang-Yueh Chan, Taichung (TW); Chien-Ping Huang, Taichung (TW); Chun-Chi Ke, Taichung (TW); Shih-Kuang Chiu, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 0 days.

(21) Appl. No.: 13/024,672

(22) Filed: Feb. 10, 2011

(30) Foreign Application Priority Data

Dec. 17, 2010 (TW) .............................. 99144690 A

(51) Int. Cl.
*H01L 23/12* (2006.01)
(52) U.S. Cl. ........................................ 257/704; 438/125
(58) Field of Classification Search .................. 257/704; 438/125
See application file for complete search history.

(56) References Cited

U.S. PATENT DOCUMENTS

| | | |
|---|---|---|
| 6,303,986 B1 | 10/2001 | Shook |
| 6,809,412 B1 | 10/2004 | Tourino et al. |
| 6,828,674 B2 | 12/2004 | Karpman |
| 6,846,725 B2 | 1/2005 | Nagarajan et al. |
| 7,368,808 B2 | 5/2008 | Heck et al. |

*Primary Examiner* — Douglas Menz
(74) *Attorney, Agent, or Firm* — Peter F. Corless; Steven M. Jensen; Edwards Wildman Palmer LLP

(57) ABSTRACT

A package structure having an MEMS element includes: a chip having at least an MEMS element and a plurality of first conductive pads; a lid disposed on the chip to cover the MEMS element and having a plurality of second conductive pads formed thereon; a plurality of bonding wires electrically connecting the first and second conductive pads; a plurality of first bumps disposed on the second conductive pads, respectively; an encapsulant formed on the chip to encapsulate the lid, the bonding wires, the first and second conductive pads and the first bumps while exposing the top surfaces of the first bumps; and a plurality of circuits formed on the encapsulant and electrically connecting to the exposed first bumps, thereby avoiding the conventional drawback of electrical connection failure caused by position deviation of bonding wires due to mold flow of the encapsulant.

15 Claims, 6 Drawing Sheets

PACKAGE STRUCTURE HAVING MEMS ELEMENT AND FABRICATION METHOD THEREOF

CROSS-REFERENCES TO RELATED APPLICATIONS

This application claims under 35 U.S.C. §119(a) the benefit of Taiwanese Application No. 099144690, filed Dec. 17, 2010, the entire contents of which is incorporated herein by reference.

BACKGROUND OF THE INVENTION

1. Field of the Invention

The present invention relates to package structures and fabrication methods thereof, and more particularly, to a package structure having an MEMS (micro-electro-mechanical system) element and a fabrication method thereof.

2. Description of Related Art

MEMS elements have integrated electrical and mechanical functions and can be fabricated through various micro-fabrication technologies. A MEMS element can be disposed on a chip and covered by a shield or packaged with an underfill adhesive so as to form an MEMS package structure. There are various types of MEMS packages, such as metal packages, ceramic packages, thin film multi-layer packages, plastic packages and so on. To form a plastic package, an MEMS chip is disposed on a substrate and electrically connected to the substrate through bonding wires and then packaged with an encapsulant.

U.S. Pat. No. 6,809,412, No. 6,303,986, No. 7,368,808, No. 6,846,725 and No. 6,828,674 disclose MEMS packages.

FIGS. 1A to 1F are cross-sectional views showing a conventional fabrication method of a plastic MEMS package.

Referring to FIG. 1A, a wafer 10 having a plurality of conductive pads 101 and MEMS elements 102 is prepared.

Referring to FIG. 1B, a plurality of lids 11 are disposed on the wafer 10 to cover the MEMS elements 102, respectively, and each of the lids 11 has a metal layer 111 formed thereon.

Referring to FIG. 1C, the conductive pads 101 and the metal layers 111 are electrically connected through bonding wires 12. Then, an encapsulant 13 is formed on the wafer 10 to encapsulate the lids 11, the bonding wires 12, the conductive pads 101 and the metal layers 111.

Referring to FIG. 1D, portions of the encapsulant 13 and the bonding wires 12 are removed. As such, the bonding wires 12 are separated into first sub-wires 121 electrically connecting to the conductive pads 101 and second sub-wires 122 electrically connecting to the metal layer 111, and the top ends of the first sub-wires 121 and the second sub-wires 122 are exposed from the top surface of the encapsulant 13.

Referring to FIG. 1E, a plurality of circuits 14 are formed on the encapsulant 13 for electrically connecting the first sub-wires 121. Then, a plurality of bumps 15 are formed on the circuits 14, respectively.

Referring to FIG. 1F, a singulation process is performed to obtain a plurality of packages 1 having MEM elements 102.

However, in the process of forming the encapsulant 13 for encapsulating the lids 11, the bonding wires 12, the conductive pads 101 and the metal layers 111, mold flow of the encapsulant 13 can easily cause deviation of the positions of the bonding wires 12 and as a result, the positions of the exposed ends of the first sub-wires 121 are changed, thereby adversely affecting the electrical connection between the circuits 14 formed subsequently on the encapsulant 13 and the first sub-wires 121 and even causing failure of the electrical connection.

Therefore, it is imperative to provide a package structure having a MEMS element so as to overcome the above-described drawback.

SUMMARY OF THE INVENTION

Accordingly, the present invention provides a package structure having an MEMS element and a fabrication method thereof so as to prevent electrical connection failure.

In order to achieve the above and other objects, the present invention provides a package structure having an MEMS element, which comprises: a chip having at least an MEMS element and a plurality of first conductive pads; a lid disposed on the chip to cover the MEMS element and having a plurality of second conductive pads formed thereon; a plurality of bonding wires electrically connecting the first conductive pads and the second conductive pads; a plurality of first bumps disposed on the second conductive pads, respectively; an encapsulant formed on the chip to encapsulate the lid, the bonding wires, the first conductive pads, the second conductive pads and the first bumps while exposing the top surfaces of the first bumps; and a plurality of circuits formed on the encapsulant and electrically connecting to the exposed first bumps.

In the above-described package structure, each of the first bumps is disposed at a position distant from or proximate to a wire end of the bonding wire on the corresponding second conductive pad.

The package structure can further comprise a plurality of second bumps disposed on the circuits, respectively. In another embodiment, the package structure further comprises an insulating layer formed on the encapsulant and the circuits and having plurality of openings for exposing the circuits, and a plurality of second bumps disposed on the exposed circuits, respectively.

The present invention further provides a fabrication method of a package structure having an MEMS element, which comprises the steps of: preparing a wafer having a plurality of first conductive pads and MEMS elements; disposing a plurality of lids on the wafer to cover the MEMS elements, respectively, wherein each of the lids has a plurality of second conductive pads formed thereon; electrically connecting the first conductive pads and the second conductive pads through a plurality of bonding wires; forming a plurality of first bumps on the second conductive pads, respectively; forming an encapsulant on the wafer to encapsulate the lids, the bonding wires, the first conductive pads, the second conductive pads and the first bumps; removing a portion of the encapsulant to expose the first bumps; forming on the encapsulant a plurality of circuits electrically connecting the first bumps; and performing a singulation process to obtain a plurality of packages having MEMS elements.

In the above-described method, each of the first bumps is formed at a position distant from or proximate to a wire end of the bonding wire on the corresponding second conductive pad.

The encapsulant is partially removed by grinding or laser drilling so as to expose the first bumps.

In the above-described package structure and fabrication method thereof, the MEMS element can be a gyroscope, an accelerometer or an RF MEMS element.

The first conductive pads are located at the periphery of the lid.

The lid can be made of metal, silicon, glass or ceramic.

The second conductive pads can be formed by sputtering or evaporation and made of Al, Cu, Au, Pd, Ni/Au, Ni/Pb, TiW/Au, Ti/Al, TiW/Al, Ti/Cu/Ni/Au or a combination thereof.

According to the present invention, a wafer having a plurality of first conductive pads and MEMS elements is provided; a plurality of lids are disposed on the wafer corresponding in position to the MEMS elements and each of the lids has a plurality of second conductive pads formed thereon; the first conductive pads and the second conductive pads are electrically connected through bonding wires; then, a plurality of first bumps are formed on the second conductive pads; thereafter, an encapsulant is formed to encapsulate the lids, the bonding wires, the first conductive pads, the second conductive pads and portions of the first bumps while exposing the top surfaces of the first bumps; subsequently, a plurality of circuits and second bumps are formed on the encapsulant for electrically connecting the first bumps; and thereafter a singulation process is performed to obtain a plurality of packages. Therefore, even if mold flow of the encapsulant causes position deviation of the bonding wires, it will not affect the electrically connection between the bonding wires and the first and second conductive pads and the positions of the first bumps will not be changed by the mold flow, thereby ensuring that the first bumps are exposed at predetermined positions for electrically connecting the circuits. Therefore, the present invention avoids the conventional drawback of electrical connection failure caused by position deviation of bonding wires due to mold flow of the encapsulant.

DETAILED DESCRIPTION OF PREFERRED EMBODIMENTS

The following illustrative embodiments are provided to illustrate the disclosure of the present invention, these and other advantages and effects can be apparent to those in the art after reading this specification.

It should be noted that the drawings are only for illustrative purposes and not intended to limit the present invention. Meanwhile, terms such as 'up', 'down', 'a' etc. are only used as a matter of descriptive convenience and not intended to have any other significance or provide limitations for the present invention.

First Embodiment

FIGS. 2A to 2H show a fabrication method of a package structure having an MEMS element according to the present invention.

Figure 1A:
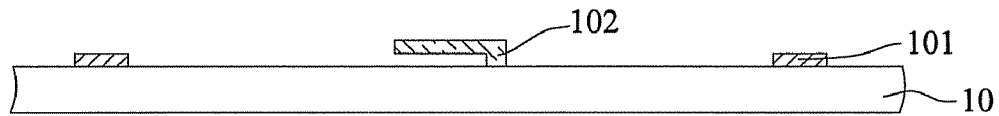
FIGS. 1A to 1F are cross-sectional views showing a conventional package structure having a MEMS element.
Figure 1B:
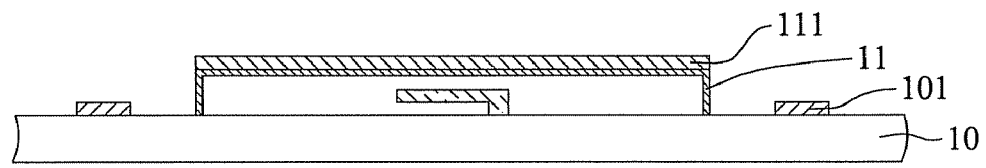
Figure 1C:
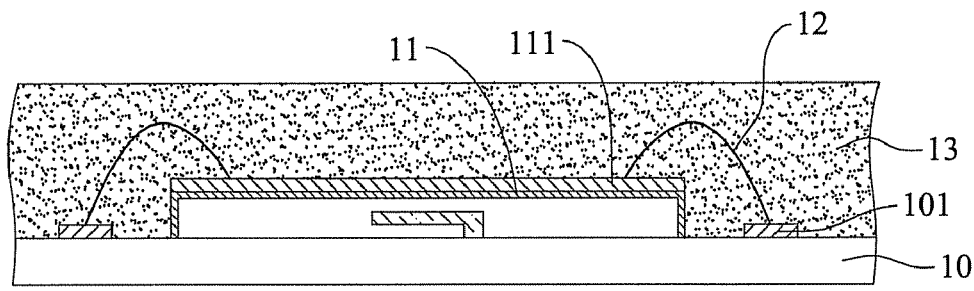
Figure 1D:
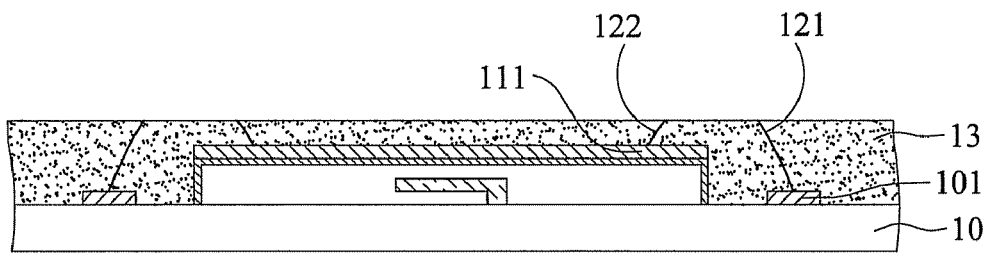
Figure 1E:
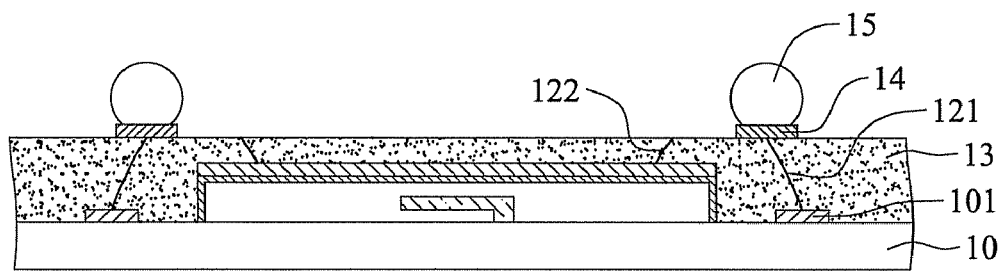
Figure 1F:
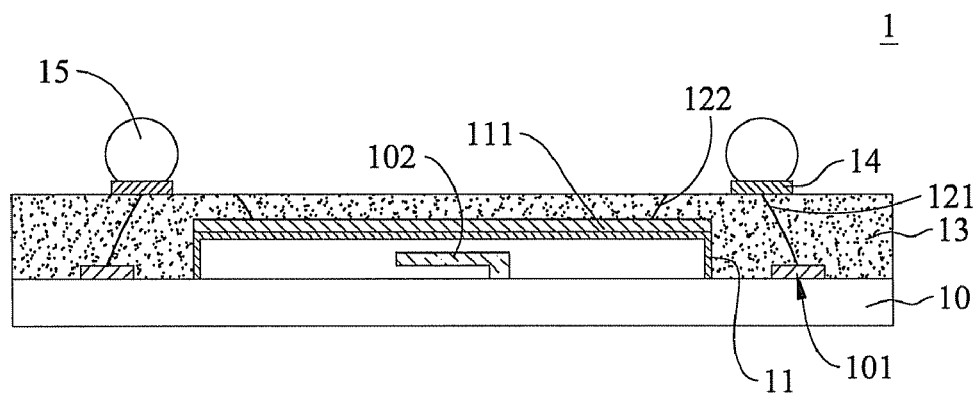
Figure 2A:
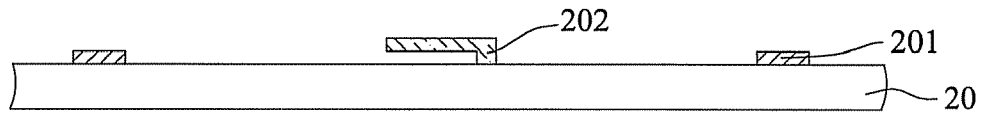
FIGS. 2A to 2H are cross-sectional views showing a fabrication method of a package structure having a MEMS element according to the present invention, wherein FIG. 2D' is an upper view of FIG. 2D, FIG. 2D" shows an embodiment in which the first bumps are located at the same positions as the bonding wires, FIGS. 2G' and 2G" show an embodiment in which the first bumps are exposed by laser drilling, and FIG. 2H' shows a package structure obtained from FIG. 2D"

Referring to FIG. 2A, a wafer 20 having a plurality of first conductive pads 201 and MEMS elements 202 is prepared. The MEMS elements 202 can be gyroscopes, accelerometers or RF MEMS elements. It should be noted that only a portion of the wafer 20 is shown in FIG. 2A.

Figure 2B:
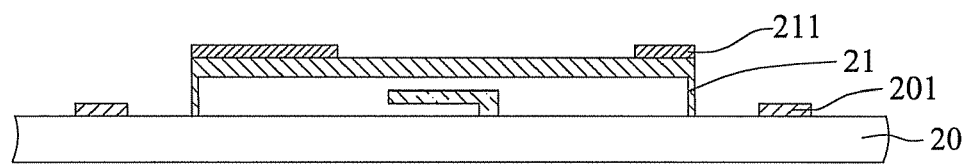

Referring to FIG. 2B, a plurality of lids 21 made of such as metal, silicon, glass or ceramic are disposed on the wafer 20 to cover the MEMS elements 202, respectively. The first conductive pads 201 are located at the peripheries of the lids 21. Each of the lids 21 has a plurality of second conductive pads 211 formed thereon, and the second conductive pads 211 can be formed by sputtering or evaporation and made of such as Al, Cu, Au, Pd, Ni/Au, Ni/Pb, TiW/Au, Ti/Al, TiW/Al, Ti/Cu/Ni/Au or a combination thereof.

Figure 2C:
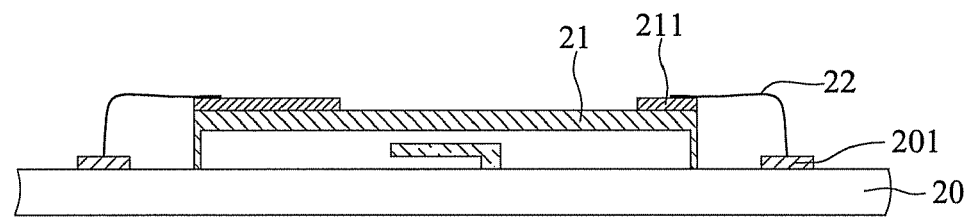

Referring to FIG. 2C, the first conductive pads 201 and the second conductive pads 211 are electrically connected by bonding wires 22 through reverse bonding.

Figure 2D:
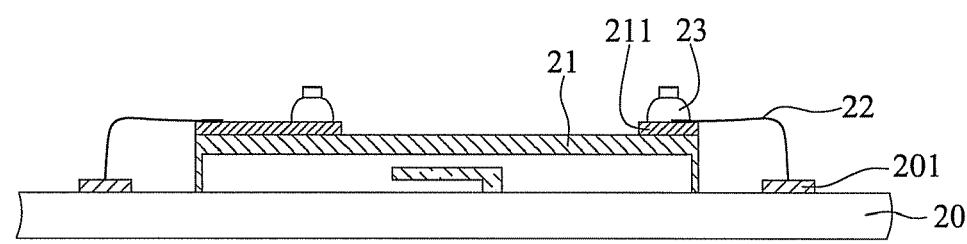
Figure 2D:
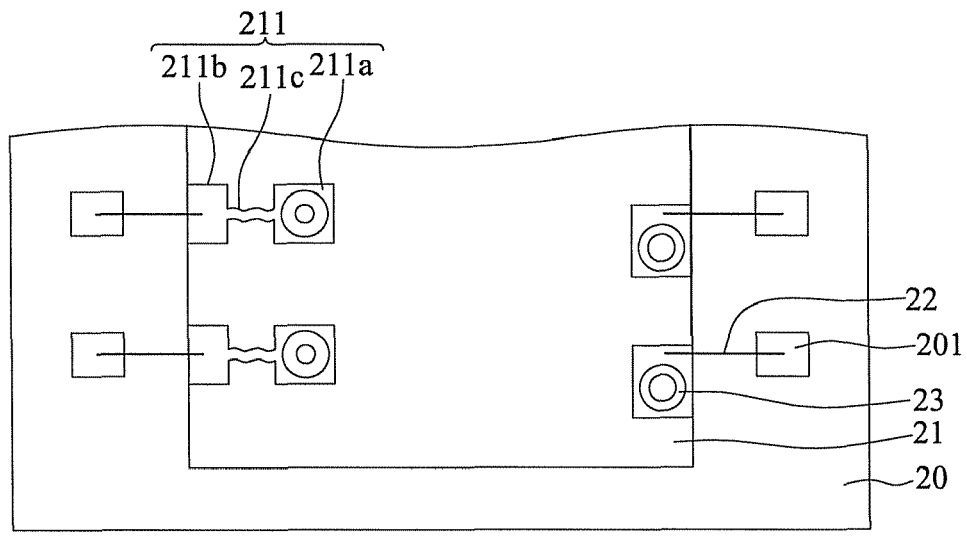

Referring to FIGS. 2D and 2D', a plurality of first bumps 23 such as stud bumps are formed on the second conductive pads 211 by such as a wire bonder. Therein, each of the first bumps 23 is formed at a position distant from the wire end of the bonding wire 22 on the corresponding second conductive pad 211. Preferably, as shown in the left side of FIG. 2D', each of the second conductive pads 211 has an end portion 211a, a front portion 211b and a conductive trace 211c connecting the end portion 211a and the front portion 211b. The conductive trace 211c is narrower than the end portion 211a and the front portion 211b, and the first bump 23 is formed on the end portion 211a and the wire end of the bonding wire 22 is connected to the front portion 211b to facilitate wire bonding and mounting of the first bump 23. It should be noted that the two different structures of the second conductive pads 211 of FIG. 2D' can be used separately or together. Further, referring to FIG. 2D", the first bumps 23 are formed at positions proximate to the wire ends of the bonding wires 22 such that both the first bumps 23 and the bonding wires 22 electrically connect to the second conductive pads 211. Preferably, the first bumps 23 are higher than the wire loops of bonding wires 22.

Figure 2E:
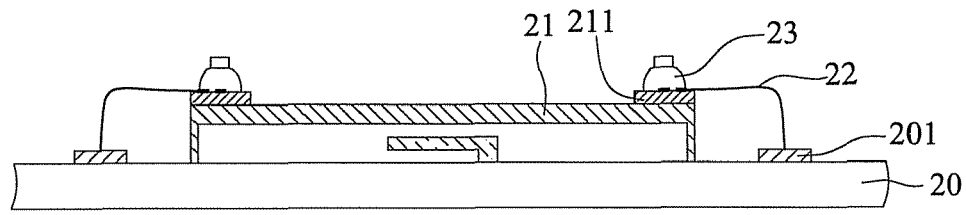
Figure 2E:
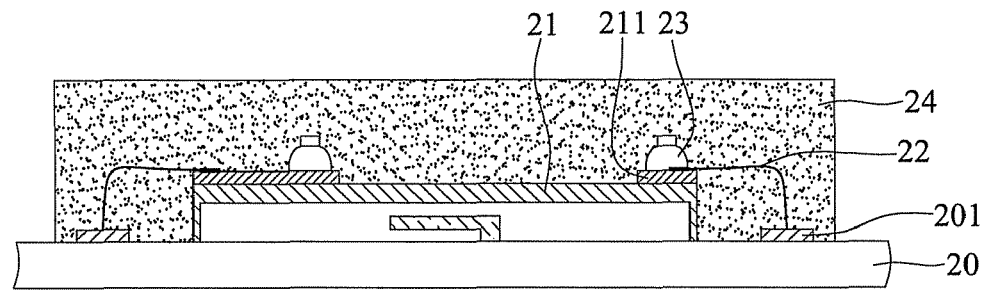

Referring to FIG. 2E, an encapsulant 24 is formed on the wafer 20 by molding so as to cover the lids 21, the bonding wires 22, the first conductive pads 201, the second conductive pads 211 and the first bumps 23.

Figure 2F:
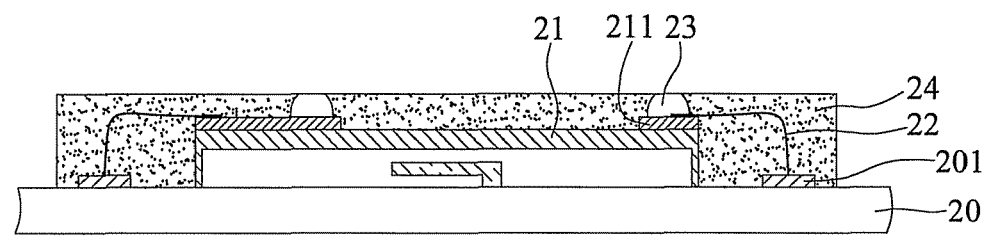

Referring to FIG. 2F, the top surface of the encapsulant 24 is ground such that a portion of the encapsulant 24 is removed (a portion of the first bumps 23 can also be removed) to expose the first bumps 23. Since the first bumps 23 instead of the bonding wires 22 are exposed from the encapsulant 24, even if the mold flow of the encapsulant 24 causes position deviation of the bonding wires 22, it will not affect the electrical connection between the bonding wires 22 and the first and second conductive pads 201, 211 and the mold flow will not change the positions of the first bumps 23, thereby ensuring that the first bumps 23 are exposed at predetermined positions for electrically connecting circuits. Therefore, the present invention avoids the conventional drawback of electrical connection failure caused by position deviation of bonding wires due to mold flow of the encapsulant.

Figure 2G:
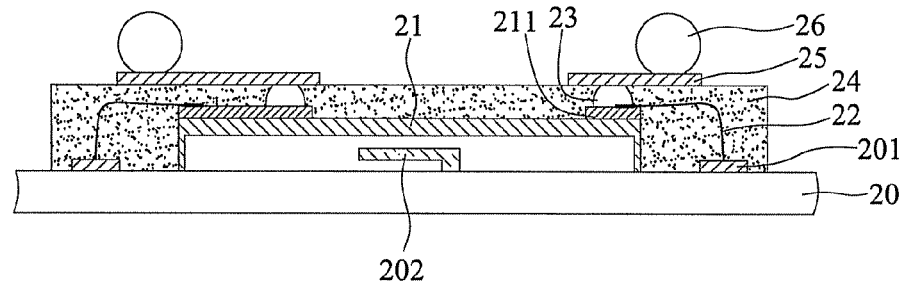
Figure 2G:
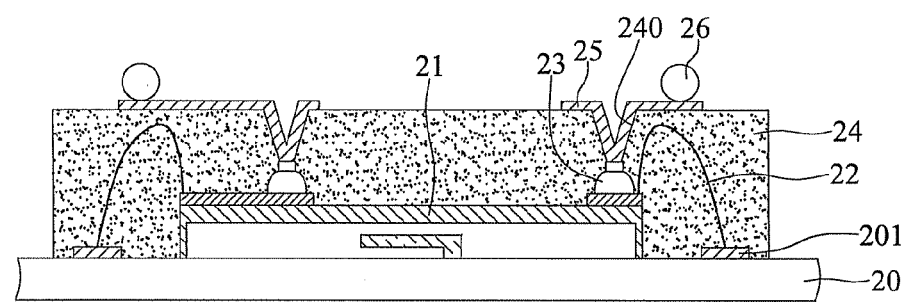

Referring to FIG. 2G a plurality of circuits 25 are formed on the encapsulant 24 and electrically connecting the first bumps 23, and then a plurality of second bumps 26 are formed on the circuits 25, respectively.

Further referring to FIGS. 2G' and 2G", the first bumps 23 are exposed by only removing the portions of the encapsulant 24 on the first bumps 23 through laser drilling. Accordingly, the height of the encapsulant 24 is still greater than that of the first bumps 23. Further, a plurality of circuits 25 are formed on the encapsulant 24 and the exposed first bumps 23, wherein the first bumps 23 can be formed distant from the wire ends of the bonding wires 22 on the second conductive pads 211 and the bonding wires 22 can be formed by forward bonding for electrically connecting the first conductive pads 201 and the second conductive pads 211 and have wire loops higher than the first bumps 23, as shown in FIG. 2G'. Alternatively, the bonding wires 22 can be formed by reverse bonding for electrically connecting the first conductive pads 201 and the second conductive pads 211, and the first bumps 23 are then formed at positions proximate to the wire ends of the bonding wires 22 on the second conductive pads 211, as shown in FIG. 2G''.

Figure 2H:
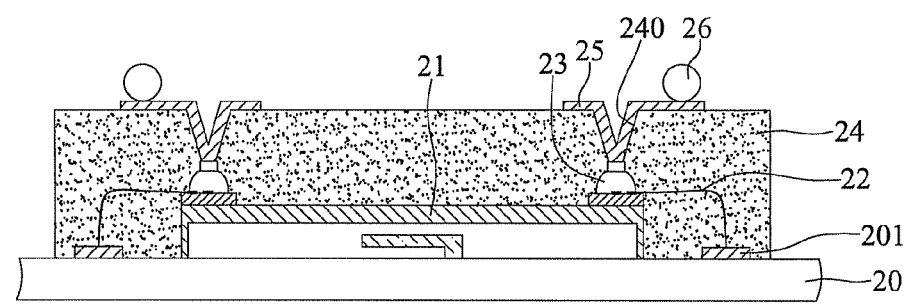
Figure 2H:
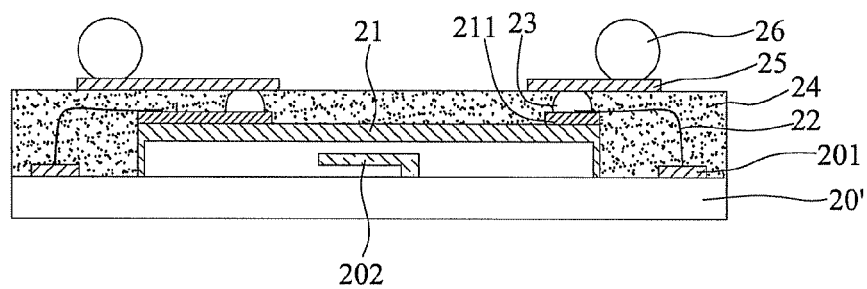
Figure 2H:
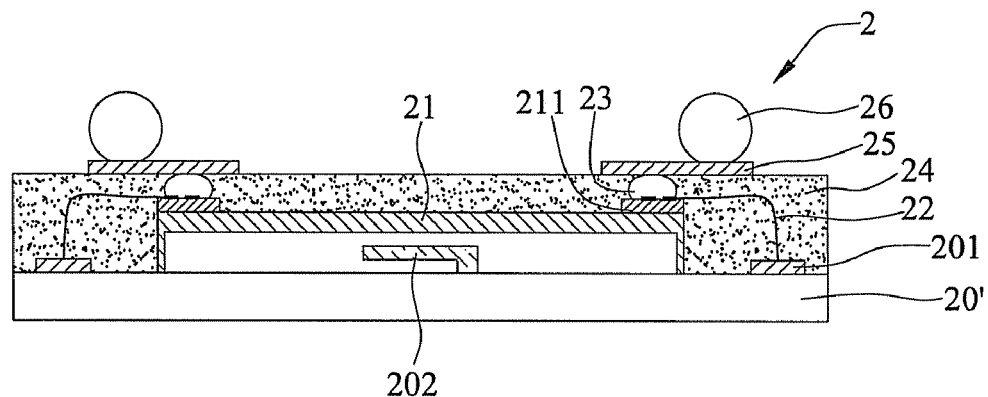

Referring to FIGS. 2H and 2H', a singulation process is performed to obtain a plurality of packages 2 having MEMS elements 202 and the wafer 20 is divided into a plurality of chips 20'. FIG. 2H is a structure obtained from FIG. 2D, and FIG. 2H' is a structure obtained from FIG. 2D''.

According to the above-described fabrication method, the present invention further provides a package structure having an MEMS element, which has a chip 20' having at least an MEMS element 202 and a plurality of first conductive pads 201; a lid 21 disposed on the chip 20' to cover the MEMS element 202 and having a plurality of second conductive pads 211 disposed thereon, wherein the first conductive pads 201 are disposed at the periphery of the lid 21; a plurality of bonding wires 22 electrically connecting the first conductive pads 201 and the second conductive pads 211; a plurality of first bumps 23 disposed on the second conductive pads 211, respectively; an encapsulant 24 disposed on the chip 20' to encapsulate the lid 21, the bonding wires 22, the first conductive pads 201, the second conductive pads 211 and the first bumps 23 while exposing the top surfaces of the first bumps 23; and a plurality of circuits 25 disposed on the encapsulant 24 and electrically connecting the exposed first bumps 23.

In the above-described package structure, the MEMS element 202 can be a gyroscope, an accelerometer or an RF MEMS element. The lid 21 can be made metal, silicon, glass or ceramic. The second conductive pads 211 can be made of Al, Cu, Au, Pd, Ni/Au, Ni/Pb, TiW/Au, Ti/Al, TiW/Al, Ti/Cu/Ni/Au or a combination thereof.

In the above-described package structure, each of the first bumps 23 can be disposed at a position distant from the wire ends of the bonding wire 22 on the corresponding second conductive pad 211, as shown in FIG. 2D; or disposed at a position proximate to the wire end of the bonding wire 22 on the second conductive pads 211, as shown in FIG. 2D'.

The package structure can further comprise a plurality of second bumps 26 disposed on the circuits 25, respectively.

Second Embodiment

Figure 3:
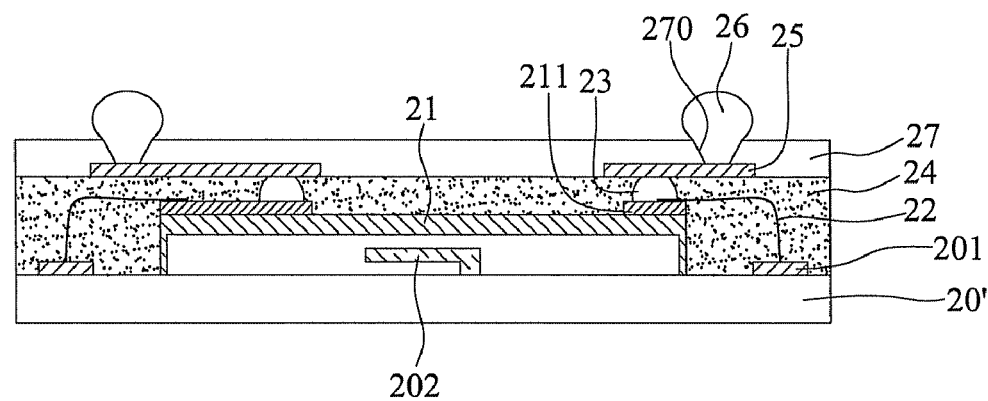
FIG. 3 is a cross-sectional view showing a package structure having an insulating layer formed thereon according to the present invention.

FIG. 3 shows a package structure having an MEMS element according to a second embodiment of the present invention. The present embodiment is similar to the first embodiment. The difference of the present embodiment from the first embodiment is that before the singulation process, an insulating layer 27 is formed on the encapsulant 24 and the circuits 25 and has a plurality of openings 270 for exposing the circuits 25; and a plurality of second bumps 26 are formed on the exposed circuits 25, respectively.

Therefore, the package structure of the present embodiment further comprises an insulating layer 27 formed on the encapsulant 24 and the circuits 25 and having a plurality of openings 270 for exposing the circuits 25; and a plurality of second bumps 26 disposed on the exposed circuits 25, respectively.

According to the present invention, a wafer having a plurality of first conductive pads and MEMS elements is provided; a plurality of lids are disposed on the wafer corresponding in position to the MEMS elements and each of the lids has a plurality of second conductive pads formed thereon; the first conductive pads and the second conductive pads are electrically connected through bonding wires; then, a plurality of first bumps are formed on the second conductive pads; thereafter, an encapsulant is formed to encapsulate the lids, the bonding wires, the first conductive pads, the second conductive pads and portions of the first bumps while exposing the top surfaces of the first bumps; subsequently, a plurality of circuits and second bumps are formed on the encapsulant for electrically connecting the first bumps; and thereafter a singulation process is performed to obtain a plurality of packages. Therefore, even if the mold flow of the encapsulant causes position deviation of the bonding wires, it will not affect the electrical connection between the bonding wires and the first and second conductive pads and the positions of the first bumps will not be changed by the mold flow, thereby ensuring that the first bumps are exposed at predetermined positions for electrically connecting the circuits. Therefore, the present invention avoids the conventional drawback of electrical connection failure caused by position deviation of bonding wires due to mold flow of the encapsulant.

The above-described descriptions of the detailed embodiments are intended to illustrate the preferred implementation according to the present invention but are not intended to limit the scope of the present invention, Accordingly, all modifications and variations completed by those with ordinary skill in the art should fall within the scope of present invention defined by the appended claims.

What is claimed is:

1. A package structure having an MEMS (Micro-Electro-Mechanical System) element, comprising:
   a chip having at least an MEMS element and a plurality of first conductive pads;
   a lid disposed on the chip to cover the MEMS element and having a plurality of second conductive pads formed thereon;
   a plurality of bonding wires electrically connecting the first conductive pads and the second conductive pads;
   a plurality of first bumps disposed on the second conductive pads, respectively;
   an encapsulant formed on the chip to encapsulate the lid, the bonding wires, the first conductive pads, the second conductive pads and the first bumps while exposing top surfaces of the first bumps; and
   a plurality of circuits formed on the encapsulant and electrically connecting to the exposed first bumps.

2. The structure of claim 1, wherein each of the first bumps is disposed at a position distant from or proximate to a wire end of the bonding wire on the corresponding second conductive pad.

3. The structure of claim 2, wherein when each of the first bumps is disposed at a position distant from the wire end of the bonding wire on the corresponding second conductive pad, the second conductive pad comprises a front portion, an end portion and a conductive trace connecting the front portion and the end portion, so as for the first bump to be disposed on the end portion and the bonding wire to disposed on the front portion.

4. The structure of claim 1, wherein the lid is made of metal, silicon, glass or ceramic.

5. The structure of claim 1, further comprising a plurality of second bumps disposed on the circuits, respectively.

6. The structure of claim 1, further comprising: an insulating layer formed on the encapsulant and the circuits and having a plurality of openings for exposing the circuits; and a plurality of second bumps disposed on the exposed circuits, respectively.

7. A fabrication method of a package structure having an MEMS element, comprising the steps of:
   preparing a wafer having a plurality of first conductive pads and the MEMS elements;
   disposing a plurality of lids on the wafer to cover the MEMS elements, respectively, wherein each of the lids has a plurality of second conductive pads formed thereon;
   electrically connecting the first conductive pads and the second conductive pads through a plurality of bonding wires;
   forming a plurality of first bumps on the second conductive pads, respectively;
   forming an encapsulant on the wafer to encapsulate the lids, the bonding wires, the first conductive pads, the second conductive pads and the first bumps;
   removing a portion of the encapsulant to expose the first bumps;
   forming on the encapsulant a plurality of circuits electrically connecting to the first bumps; and
   performing a singulation process to obtain a plurality of packages having MEMS elements.

8. The method of claim 7, wherein each of the first bumps is formed at a position distant from or proximate to a wire end of the bonding wire on the corresponding second conductive pad.

9. The method of claim 8, wherein when each of the first bumps is formed at a position distant from the wire end of the bonding wire on the corresponding second conductive pad, the second conductive pad comprises a front portion, an end portion and a conductive trace connecting the front portion and the end portion, so as for the first bump to be formed on the end portion and the bonding wire to be formed on the front portion.

10. The method of claim 8, wherein the first bumps are stud bumps formed by a wire bonder.

11. The method of claim 7, wherein the encapsulant is partially removed by grinding or laser drilling so as to expose the first bumps.

12. The method of claim 7, wherein the lids are made of metal, silicon, glass or ceramic.

13. The method of claim 7, wherein the second conductive pads are formed by sputtering or evaporation.

14. The method of claim 7, before the singulation process, further comprising the step of forming a plurality of second bumps on the circuits, respectively.

15. The method of claim 7, before the singulation process, further comprising the steps of forming an insulating layer on the encapsulant and the circuits, wherein the insulating layer has a plurality of openings for exposing the circuits; and forming a plurality of second bumps on the exposed circuits.

* * * * *